US009746877B2

(12) United States Patent
Zhou et al.

(10) Patent No.: US 9,746,877 B2
(45) Date of Patent: Aug. 29, 2017

(54) DETECTING AND CORRECTING AN ERROR IN A DIGITAL CIRCUIT

(71) Applicant: AGENCY FOR SCIENCE, TECHNOLOGY AND RESEARCH, Singapore (SG)

(72) Inventors: Jun Zhou, Singapore (SG); Xin Liu, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/897,134

(22) PCT Filed: Jun. 5, 2014

(86) PCT No.: PCT/SG2014/000258
§ 371 (c)(1),
(2) Date: Dec. 9, 2015

(87) PCT Pub. No.: WO2014/200430
PCT Pub. Date: Dec. 18, 2014

(65) Prior Publication Data
US 2016/0116937 A1     Apr. 28, 2016

(30) Foreign Application Priority Data
Jun. 11, 2013  (SG) .............................. 201304506-7

(51) Int. Cl.
*H03K 3/13*      (2006.01)
*G06F 1/08*      (2006.01)
*H03K 3/037*     (2006.01)

(52) U.S. Cl.
CPC ............. *G06F 1/08* (2013.01); *H03K 3/0375* (2013.01)

(58) Field of Classification Search
CPC ........................................................ G06F 1/08
See application file for complete search history.

(56) References Cited

U.S. PATENT DOCUMENTS

| 2010/0079184 A1 | 4/2010 | Bowman et al. |
| 2012/0074982 A1 | 3/2012 | Rebaud et al. |

(Continued)

FOREIGN PATENT DOCUMENTS

WO     2014200430 A1    12/2014

OTHER PUBLICATIONS

Wirnshofer et al., "On-Line Supply Voltage Scaling Based on In Situ Delay Monitoring to Adabt for PVTA Variations," Journal of Circuits, Systems and Computers, vol. 21, Issue 08, Dec. 2012, 2 p. (Abstract).

(Continued)

*Primary Examiner* — Daniel Puentes
(74) *Attorney, Agent, or Firm* — Conley Rose, P.C.

(57) ABSTRACT

A method for detecting and correcting an error in a circuit is provided. The circuit is configured to receive an input signal and clock the input signal with a rising and falling timing signal. The method includes detecting late arrival signal transition of the input signal, at an intermediate point of a path, the path being one through which the input signal transits. The method further includes predicting an error in the input signal in response to detecting the late arrival signal transition at the intermediate point of the path. In addition, the method includes correcting the error in the input signal by manipulating the timing signal and/or a supply voltage.

17 Claims, 4 Drawing Sheets

(56) References Cited

U.S. PATENT DOCUMENTS

2014/0225655 A1* 8/2014 Rasouli ................. H03K 5/135
327/161
2014/0266334 A1* 9/2014 Pham ..................... H03K 3/012
327/142

OTHER PUBLICATIONS

ASTAR, International Preliminary Report on Patentability mailed Oct. 14, 2015, PCT App. No. PCT/SG2014/000258, 5 p.
ASTAR, International Search Report mailed Sep. 1, 2014, PCT App. No. PCT/SG2014/000258, 3 p.

* cited by examiner

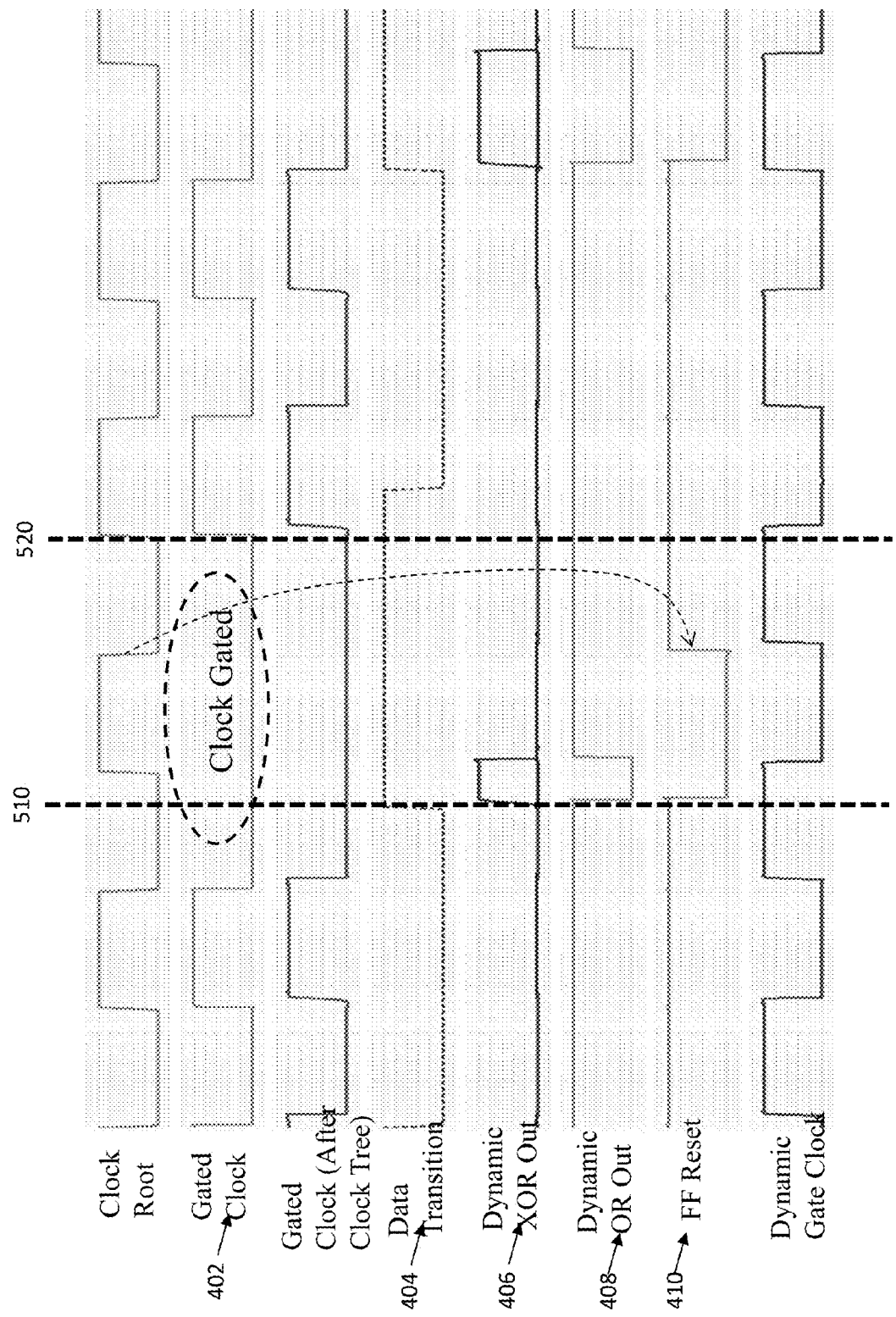

DETECTING AND CORRECTING AN ERROR IN A DIGITAL CIRCUIT

CROSS-REFERENCE TO RELATED APPLICATION

The present application is the U.S. National Stage under 35 U.S.C. §371 of International Patent Application No. PCT/SG2014/000258, filed Jun. 5, 2014, which claims priority to Singapore Application No. SG 201304506-7, filed Jun. 11, 2013, the disclosures of which are hereby incorporated herein by reference.

FIELD OF INVENTION

The present invention relates broadly to a method and circuit for detecting and correcting timing errors in digital circuits.

BACKGROUND

Researchers, companies and institutions are interested in understanding errors in a circuit. One such example is an error introduced by on-chip variations (e.g. by process/voltage/temperature variations). Particularly, these entities are interested to find out when an error may occur and how to prevent it. This will allow these entities to detect possible errors in a circuit and prepare how to prevent such errors.

As such, resources are invested to identify and predict an error in a circuit. In order to do so, great effort has been taken to identify an error in a circuit, especially so in recent times, as advanced technology nodes are adopted to improve performance and reduce power consumption which results in increasing on-chip variability. Consequently, this causes error in circuits. It is important to design the circuits such that delay and power consumption are minimised or prevented, without compromising the reliability of circuits.

Conventional means of determining an error in a circuit include using global variation detection techniques (e.g. on-chip variation sensor and critical path replica) for sensing the error and tuning the clock or supply voltage accordingly. One of the problems of such conventional means is that they tend to provide an analysis without capturing the local variations of the circuit such as the within-die variation and power supply noise.

In order to overcome the shortcomings of adaptive tuning circuits, in-situ variation detection techniques are used to capture the local variations. There are mainly two types of in-situ error detection techniques, namely Razor and Canary. According to the Razor technique, a shadow flip flop is used to detect timing errors at a destination flip flop. However, one disadvantage of this technique is that the error detection is performed after the clock rising edge of the clocking signal. Therefore, in order to differentiate late-arriving data from early-arriving data, the minimum path delay has to be adjusted to be longer than the detection period by inserting buffers. This effectively increases the hold time constraint of the flip flop, and causes significant overhead in area and power consumption. It can also cause problems for timing closure because fixing the hold time for one path can easily violate the setup time for another path, especially for low voltage operation where the fluctuation of delays in path is significant. Another disadvantage of this technique is that the correction is performed through architectural replay, which is only available in high-performance processors supporting branch prediction. As such, this prevents the application of this technique to a general design.

Another conventional in-situ variation detection technique that is commonly used is the Canary technique. According to the Canary technique, a flip flop is used to predict the error by capturing the artificially delayed data at the receiver flip flop. This is done in combination with dynamic voltage scaling in a way that the supply voltage will be step-by-step decreased from nominal voltage until an error is predicted to find out the lowest operating voltage (for lowest power consumption) with correct functionality.

The advantage of this technique is that it does not require inserting buffer time which means less overhead and easier for timing closure. However, in practice, some critical paths may not be activated during a monitoring time period (before decreasing voltage at each step) which means that errors will still occur in the circuit without any prediction. A way to reduce the risk is to make the monitoring time period sufficiently long before decreasing voltage so as to activate most of the critical paths. However, this will reduce the energy efficiency achieved, and it still cannot eliminate the error because the path may be activated at an unpredictable time. Additionally, this technique does not prevent errors caused by fast dynamic variation such as power supply noise and soft error since they are unpredictable. As such, these techniques are typically suitable for applications where errors are allowable, for example, image or video codec.

Thus, what is needed is a method and circuit for detecting and correcting error in digital circuits that is easy to apply to a general design, without a lot of overhead. Furthermore, other desirable features and characteristics will become apparent from the subsequent detailed description and the appended claims, taken in conjunction with the accompanying drawings and this background of the disclosure.

SUMMARY

According to the Detailed Description, a method for detecting and correcting an error in a digital circuit is provided. The circuit is configured to receive an input signal and clock the input signal with a rising and falling timing signal. The method includes detecting late arrival signal transition of the input signal, at an intermediate point of a path, the path being one through which the input signal transits. The method further includes predicting an error in the input signal in response to detecting the late arrival signal transition at the intermediate point of the path. In addition, the method includes correcting the error by manipulating the timing signal and/or a supply voltage.

In accordance with another aspect, a circuit for detecting and correcting an error in a digital circuit is provided. The circuit is configured to receive an input signal and clock the input signal with a rising and falling timing signal. The circuit includes a means for detecting late arrival signal transition of the input signal, at an intermediate point of a path, the path being one through which the input signal transits. The device further includes a means for predicting an error in the input signal in response to detecting the late arrival signal transition at the intermediate point of the path. In addition, the circuit includes correcting the error by manipulating the timing signal and/or a supply voltage.

BRIEF DESCRIPTION OF THE DRAWINGS

The accompanying figures where like reference numerals refer to identical or functionally similar elements throughout the separate views and which together with the detailed description below are incorporated in and form part of the specification, serve to illustrate various embodiments and to explain various principles and advantages in accordance with a present embodiment.

FIG. 4 shows simulation timing waveforms of the device shown in FIG. 2.

DETAILED DESCRIPTION

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

Figure 1:
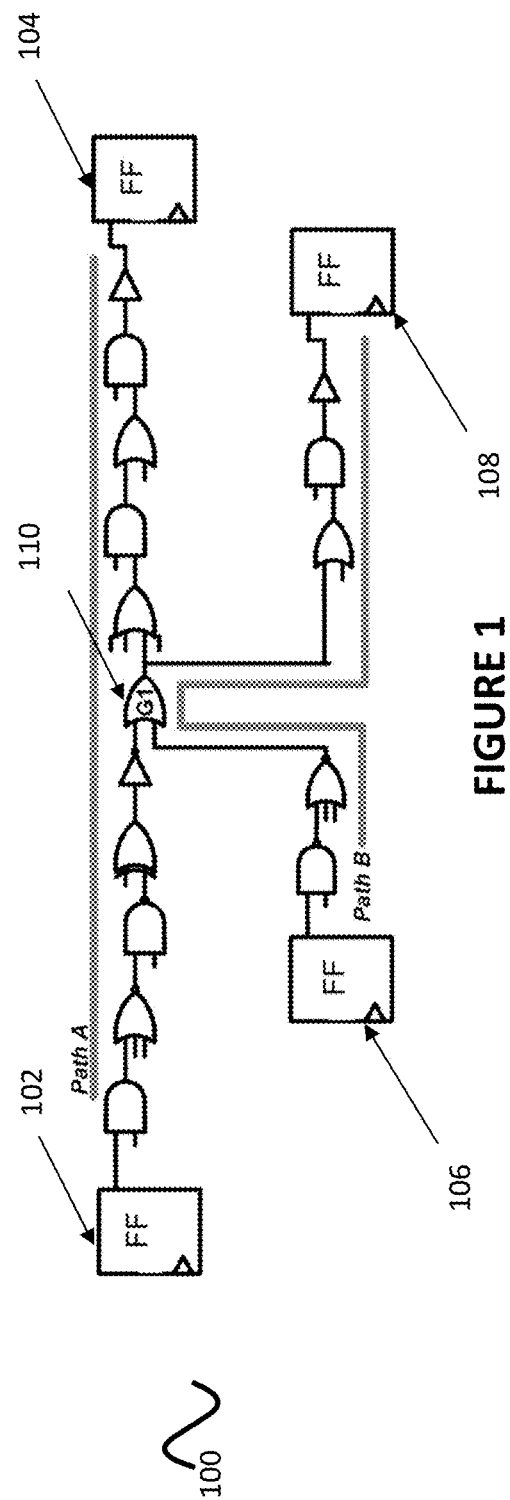
FIG. 1 is a schematic circuit diagram of a device for detecting error in an example embodiment.

FIG. 1 is a schematic circuit diagram of a device 100 for detecting error in an example embodiment which includes flip flops 102, 104, 106 and 108 coupled to a gate 110 in an example embodiment.

In a specific implementation, path A is a critical path. The critical path typically refers to a path between a source flip flop (for example, at flip flop 102) and a destination flip flop (for example, at flip flop 104) with the maximum delay. Once the circuit timing has been computed, the critical path may be found by computational method such as traceback method. The slack time typically refers to the difference between the required time of arrival and the actual arrival time of a signal.

In the example embodiment, the slack time associated with path A refers to the difference between the required time and the arrival time. Required time refers to the time that a signal is required to arrive at a destination flip flop without violating the timing. Arrival time refers to the time that a signal actually arrives at the destination flip flop. For example, negative slack means that path A is too slow and the signal cannot arrive at the destination flip flop before the required time, and the path should be sped up to avoid a timing violation (e.g. timing error).

However, the time when a signal arrives at the output can vary due to many reasons; for example, the temperature and voltage of the circuit may change the path delay. Further, there may be manufacturing differences in the construction of the circuit. As such, it is important to predict if there is any timing error of the signal arrival at the flip flop 104. Some of the possible timing errors include a setup time violation which refers to a late arrival of a signal which means that signal has missed the time when it should arrive.

In the example embodiment shown in FIG. 1, the time at which the signal arrives is detected at the gate 110. In the specific implementation, the time at which the signal arrives is detected before the clock rising edge of a clocking signal. The clocking signal is one which clocks the input signal with a rising and falling edge.

In the event that the signal arrives at the gate 110 is later than the required time, it may be considered that there will be late arrivals signal transition at the destination flip flop, in this instance flip flop 104. This will lead to a timing error.

In the example embodiment, the detection of the late arrival signal transition is performed at the gate 110 which is positioned substantially at half-path point of path A. The half-path point refers to the point where the delay is half of the delay of the full path. A path is one through which the input signal transits The falling edge of the clocking signal can be used as a timing reference. As such, a signal transition arriving after the falling edge of the clocking signal at the half path delay is seen as a potential timing error. In other implementation, the detection of the late arrival signal transition can be performed at other intermediate points of the critical path (e.g. 1/3, 1/4, 2/3 path) depending on the location at which a logic gate (e.g. gate 101) is placed. Further, the corresponding timing reference can be used for the detection.

The half path point of a circuit shares most on-chip variations with the full path point. The on-chip variations include inter-die process variation, temperature variation and power supply variation. Further, a critical path typically composes of numerous logic gates and the effect of within-die variation at the half path is similar to that at the full path due to averaging effect. This allows the half path error to be used to predict an error at full path.

Figure 2:
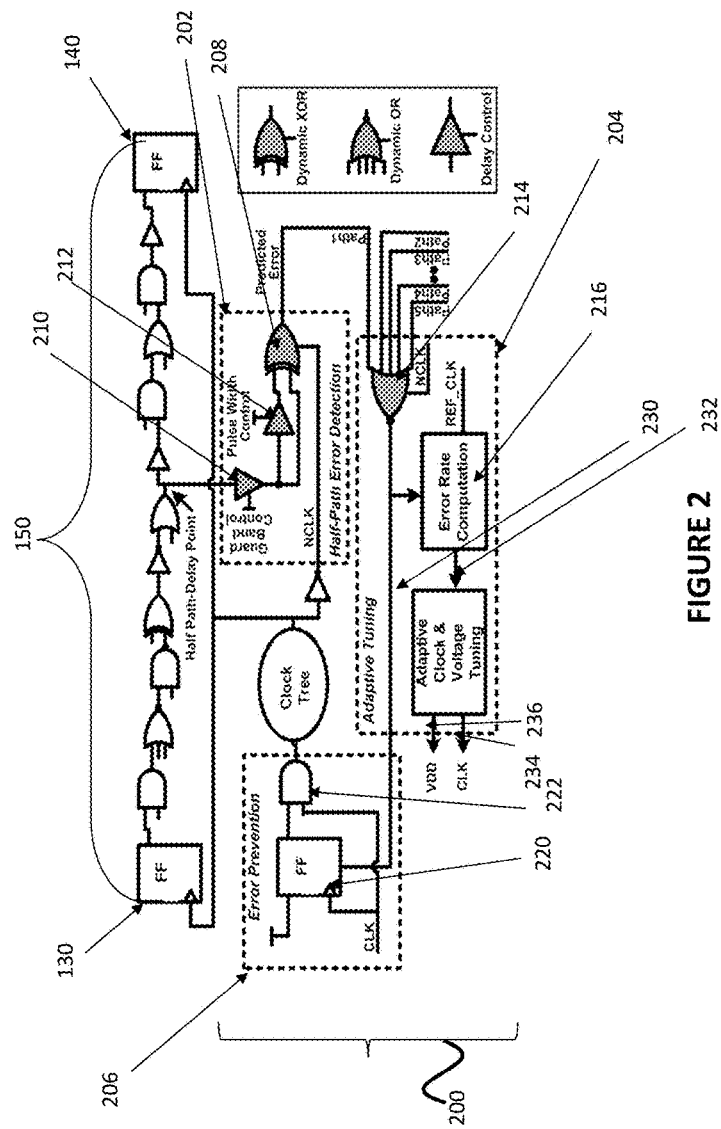
FIG. 2 is a schematic circuit diagram of a device for detecting error in an example embodiment.

FIG. 2 shows a schematic circuit diagram of a circuit 200 for detecting error in an example embodiment. The circuit 200 may include three components namely a half-path based error prediction 202, an error prevention 206 and an adaptive tuning component 204.

The circuit 150 is configured to receive an input signal. Further, the circuit is configured to clock the input signal with a rising and falling timing signal, for example a clocking signal. The circuit includes a source flip flop 130 and a destination flip flop 140.

In the example embodiment, the circuit 200 is arranged at substantially half-path point of the circuit 150. In other words, the circuit 200 is arranged at substantially half way between the source flip flop 130 and the destination flip flop 140.

A half-path based error prediction 202 includes a XOR gate 208 coupled to delay elements 210, 212. The XOR gate 208 typically refers to a digital logic gate that implements an exclusive OR that is, a true output (1/HIGH) results if one and only one of the inputs to the gate is true. If both inputs are false, both are true, a false output results. In other words, an XOR represents the inequality function, e.g. the output is true if the inputs are not alike otherwise the output is false.

The XOR gate 208 is configured to charge when a falling edge of the clock arrives. In other words, in the specific implementation, the XOR gate 208 is falling edge triggered.

The delay element 210 functions as guard band for covering any mismatch in time between the first half-path and the second half-path. The delay element 212 is used to control the output pulse width of the XOR gate 208.

Where a XOR gate 208 is used as shown in the example of FIG. 2, two delay elements 210 and 212 are used. One of these two delay elements, in this instance delay element 212, is used to provide sufficient pulse width for generating the timing error signal from the signal transitions. The delay elements 210 and 212 may be designed with variable delay using transmission gate. The variable delay may be controlled externally by adjusting the gate voltage of the transmission gate. Outputs of the delay elements 210 and 212 are fed into the XOR gate 208 as inputs. The XOR gate 208 is configured to receive these inputs to generate an output.

The adaptive tuning component 204 includes an OR gate 214 coupled to an error rate computation unit 216 and an adaptive clock and voltage tuning unit 218. The OR gate 214 is configured to receive the output of the XOR gate 208 as an input in order to generate an output 230. In a specific implementation, the output of the XOR gate 208 may be fed into one of various input channels of the OR gate 214, in this instance, path 1, path 2, pate 3, path 4 or path 5.

The output 230 of the OR gate 214 is the predicted error signal 230. The predicted error signal 230 may be fed into the error rate computation unit 216 and the adaptive clock and voltage tuning unit 218. In the example embodiment, the error rate computation unit 216 includes a reference clock and a counter (not shown for the sake of simplicity). The error rate computation unit 216 is configured to count the number or frequency of errors based on the predicted error signal 230 and determine if the number or frequency of errors exceeds a threshold number. When it is determined that the number or frequency of errors exceeds a threshold number, an input 232 is fed into the adaptive clock and voltage tuning unit 218. This allows the adaptive clock and voltage tuning unit 218 to decrement the clock frequency to generate a clock signal with a decremented frequency 234. When it is determined that the number or frequency of errors exceeds a threshold number, the adaptive clock and voltage tuning unit 218 may also increment the supply voltage to generate a voltage having a higher supply 236.

In the example embodiment, the error prevention 206 includes a flip flop 220 coupled to an AND gate 222. Each of the flip flop 220 and the AND gate 222 is configured to receive the clock signal as an input. The flip flop 220 is configured to receive the predicted error signal 230 as another input so that 220 will be reset by the predicted error signal 230 for clock gating. This allows more time for signal propagation so as to prevent the error.

Figure 3:
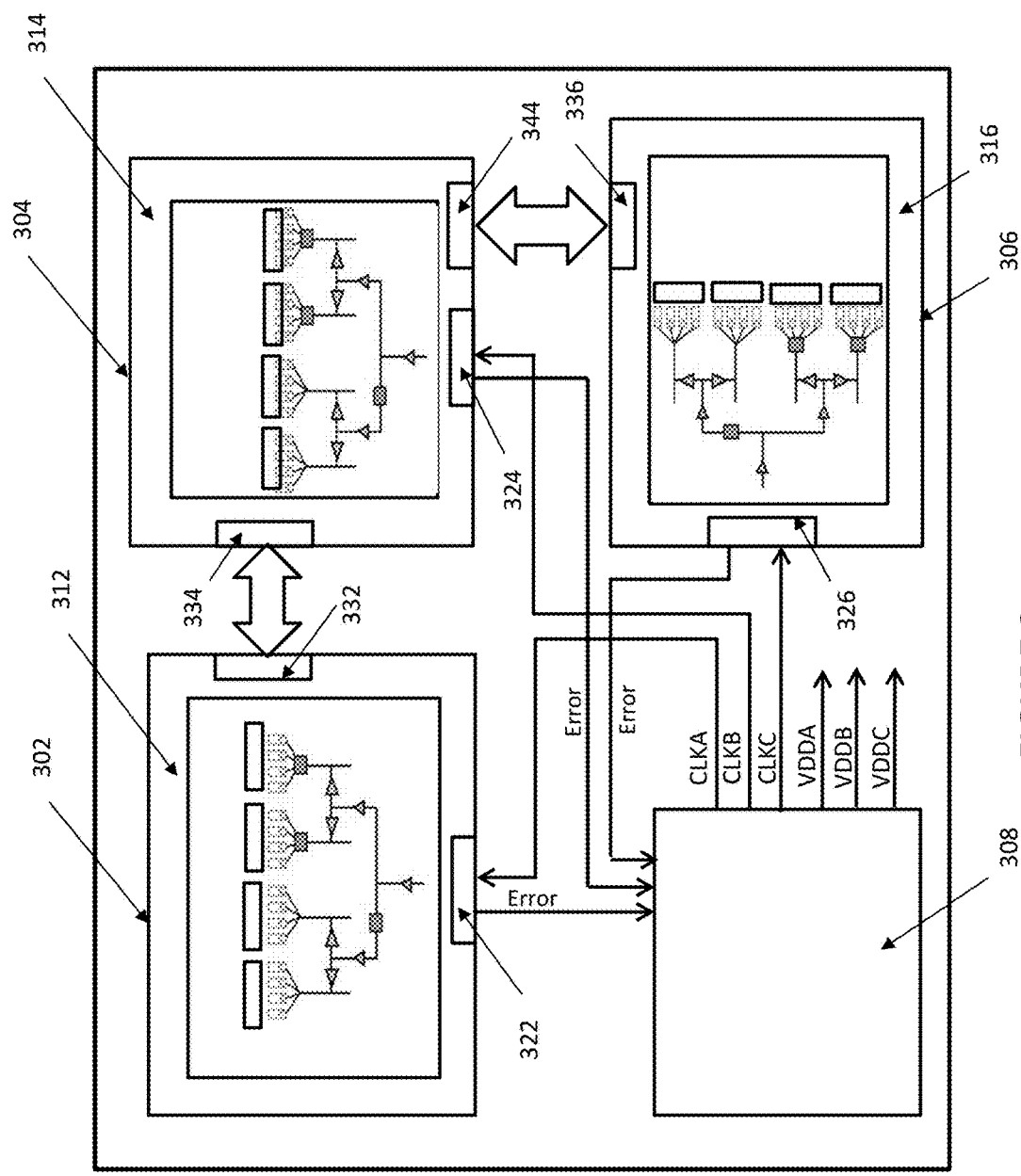
FIG. 3 is a system diagram of a device for detecting error in an example embodiment.

Referring to FIG. 3, a circuit for detecting and correcting error is illustrated in a system on chip architecture. The system is divided into multiple functional blocks (e.g. 302, 304 and 306) and the error prediction and prevention circuit 200 is placed in each of them by constraining the delay of the error paths through sub clock tree so that the predicted error signal arrives at the error prevention 204 before the next rising edge of the clock. In a system on chip architecture, an adaptive clock and voltage tuning 308 is shared by the multiple functional blocks.

FIG. 3 shows functional blocks 302, 304 and 306 that are coupled to communicate with the adaptive clock and voltage tuning 308. A "functional block" relates to a function between at least one input variable and at least one output variable. A function is described as a set of elementary blocks and input and output variables are usually connected to blocks by connection lines.

Each of the functional blocks 302, 304 and 306 includes a wrapper 312, 314 and 316 respectively. Each of these wrappers 312, 314 and 316 include a local clock gating 322, 324 and 326, and at least one interface control circuit 332, 334, 336 respectively, In the example embodiment, the wrapper 314 includes two interface control circuits 334 and 344.

Each of the functional blocks is configured to exchange error information with another function block via the interface control circuit for the control of data communication. For example, if an error is detected in the functional block 302, it will pass the error information to the functional block 304 through the interface control circuits 332 and 334 so that the functional block 304 can wait before sending/receiving new data to/from the functional block 302. In the example embodiment, the data communication between the functional blocks may be based on handshake protocols.

Further, the functional blocks 302, 304 and 306 are configured to generate a local clock gating signal based on the predicted timing error. The local clock gating signal is used to control the handshake signals (e.g. REQ and ACK) that are exchanged between the interface control circuits 332, 334, 344 and 336.

The local clock gating signals generated by the functional blocks are sent to the adaptive clock and voltage tuning unit 308 for error computation and adaptive tuning. The adaptive clock and voltage tuning unit 308 is configured to count the number or frequency of timing errors in each of the functional blocks 302, 304 and 306. Based on the number or frequency of timing errors, the error rate computation and adaptive clock unit 308 adjusts the voltage for the functional blocks 302, 304 and 306.

FIG. 4 shows the simulation waveforms of the device shown in FIG. 2. Waveform 402 shows rising and falling edges of a clocking signal. Waveform 404 shows signal transition at the detection point (e.g. half-path delay point in the example embodiment) Waveform 406 represents an output of an XOR gate. Waveform 408 represents an output of an OR gate. Waveform 410 represents the signal transition of a flip flop wherein the falling edge of waveform 410 represents resetting of the flip flop.

At time 510, the rising edge of waveform 404 arrives later than the falling edge of waveform 402. In other words, there is a late arrival of signal transition of the input signal at the time 510. This triggers a rising edge in waveform 406 which represents that a timing error is detected. The detection of the timing error causes a falling edge in waveform 408 which means that a downward pulse is resulted at the output of the OR gate. Further at the time 510, a falling edge is seen in waveform 410 which represents a resetting of the flip flop. This allows the next high phase of the clock to be gated to allow more time for the signal to propagate without impacting the operation of the circuit. The timing error signal is also used for the calculation of the error rate, based on which the system clock and supply voltage are adjusted adaptively to achieve optimal system performance and energy efficiency.

Advantageously, this technique eliminates the necessity to differentiate the late-arriving signal transitions from the early-arriving transitions by inserting buffer time. This reduces the overhead and makes the timing closure easier especially for low voltage operation.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

The invention claimed is:

1. A method for detecting and correcting an error in a digital circuit receiving an input signal and clocking the input signal with a rising and falling timing signal, the method comprising:

detecting late arrival signal transition of the input signal at an intermediate point of a path, the path being one through which the input signal transits;

predicting an error in the input signal in response to detecting the late arrival signal transition at the intermediate point of the path;

counting the number and/or frequency of errors in the input signal;

determining if the number and/or frequency of errors in the input signal is above a threshold; and correcting the error in the input signal by reducing a frequency of the rising and falling timing signal when it is determined that the number of errors in the input signal is above the threshold.

2. The method according to claim 1, further comprising preventing the error in the input signal by gating the rising and falling timing signal when it is predicted that there is an error in the input signal.

3. The method according to claim 1, wherein the frequency of the rising and falling timing signal is reduced by an adaptive clock and voltage tuning circuit.

4. The method according to claim 1, wherein correcting the error in the input signal comprises increasing the supply voltage when it is determined that the number of errors in the input signal is above the threshold.

5. The method according to claim 4, wherein the input voltage is increased by an adaptive clock and voltage tuning circuit.

6. A method for detecting and correcting an error in a digital circuit receiving an input signal and clocking the input signal with a rising and falling timing signal, the method comprising:

detecting late arrival signal transition of the input signal at an intermediate point of a path, the path being one through which the input signal transits;

predicting an error in the input signal in response to detecting the late arrival signal transition at the intermediate point of the path;

counting the number and/or frequency of errors in the input signal;

determining if the number and/or frequency of errors in the input signal is above a threshold; and correcting the error in the input signal by reducing a frequency of the rising and falling timing signal when it is determined that the frequency of errors in the input signal is above the threshold.

7. The method according to claim 6, wherein the frequency of the rising and falling timing signal is reduced by an adaptive clock and voltage tuning circuit.

8. The method according to claim 6, wherein correcting the error in the input signal comprises increasing the supply voltage when it is determined that the frequency of errors in the input signal is above the threshold.

9. The method according to claim 8, wherein the input voltage is increased by an adaptive clock and voltage tuning circuit.

10. A circuit for detecting and correcting an error in a digital circuit receiving an input signal and clocking the input signal with a rising and falling timing signal, the circuit comprising:

a path through which the input signal transits comprising two flip-flops and a plurality of logic gates between the two flip-flops;

a means for detecting late arrival signal transition of the input signal at an intermediate point of the path, the intermediate point of the path being a point at which the input signal has transited through at least one of the plurality of logic gates;

a means for predicting an error in the input signal in response to detecting the late arrival signal transition at the intermediate point of the path; and a means for correcting the error in the input signal by manipulating the rising and falling timing signal and/or a supply voltage.

11. The circuit according to any of claim 10, further configured to count the number and/or frequency of errors in the input signal.

12. The circuit according to claim 11, further configured to determine if the number and/or frequency of errors in the input signal is above a threshold.

13. The circuit according to claim 12, wherein correcting the error in the supply signal comprises increasing the supply voltage when it is determined that the number or frequency of errors in the input signal is above the threshold.

14. The circuit according to claim 13, further comprising an adaptive clock and voltage tuning circuit configured to increase the supply voltage.

15. A circuit for detecting and correcting an error in a digital circuit receiving an input signal and clocking the input signal with a rising and falling timing signal, the circuit comprising:

a means for detecting late arrival signal transition of the input signal at an intermediate point of a path, the path being one through which the input signal transits;

a means for predicting an error in the input signal in response to detecting the late arrival signal transition at the intermediate point of the path;

a means for counting the number and/or frequency of errors in the input signal;

a means for determining if the number and/or frequency of errors in the input signal is above a threshold; and a means for correcting the error in the input signal by reducing a frequency of the rising and falling timing signal when it is determined that the number and/or frequency of errors in the input signal is above the threshold.

16. The circuit according to claim 15, further configured to prevent the error in the input signal by gating the rising and falling timing signal when it is predicted that there is an error in the input signal.

17. The circuit according to claim 15, further comprising an adaptive clock and voltage tuning circuit configured to reduce the frequency of the rising and falling timing signal.

* * * * *